United States Patent
Yi et al.

(10) Patent No.: US 11,258,454 B2
(45) Date of Patent: Feb. 22, 2022

(54) ANALOG-DIGITAL CONVERTER

(71) Applicant: Nippon Telegraph and Telephone Corporation, Tokyo (JP)

(72) Inventors: Il-Min Yi, Tokyo (JP); Naoki Miura, Tokyo (JP); Hiroyuki Fukuyama, Tokyo (JP); Hideyuki Nosaka, Tokyo (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 0 days.

(21) Appl. No.: 17/285,086

(22) PCT Filed: Oct. 15, 2019

(86) PCT No.: PCT/JP2019/040417
§ 371 (c)(1),
(2) Date: Apr. 13, 2021

(87) PCT Pub. No.: WO2020/090434
PCT Pub. Date: May 7, 2020

(65) Prior Publication Data
US 2021/0367608 A1    Nov. 25, 2021

(30) Foreign Application Priority Data

Oct. 30, 2018  (JP) .............................. JP2018-203541

(51) Int. Cl.
*H03M 1/00* (2006.01)
*H03M 1/36* (2006.01)
(Continued)

(52) U.S. Cl.
CPC ........... *H03M 1/36* (2013.01); *H03M 1/1245* (2013.01); *H03M 1/50* (2013.01)

(58) Field of Classification Search
CPC ........ H03M 1/36; H03M 1/1245; H03M 1/50; H03M 1/124; G11C 27/02
(Continued)

(56) References Cited

U.S. PATENT DOCUMENTS 5,790,061 A * 8/1998 Norimatsu ............ H03M 1/367
                                                                341/120
7,986,256 B2 * 7/2011 Yamamoto .......... H03M 1/1245
                                                                341/155

(Continued)

OTHER PUBLICATIONS

B. Razavi, "A Circuit for All Seasons," The Flash ADC, IEEE Solid-State Circuits Magazine, Aug. 25, 2017, 5 pages.
(Continued)

*Primary Examiner* — Jean B Jeanglaude
(74) *Attorney, Agent, or Firm* — Slater Matsil, LLP

(57) ABSTRACT

An embodiment target time comparison circuit corresponding to a target approximate voltage range among $2^K$ time comparison circuits in a second comparison circuit compares a comparison operation time difference included in voltage comparison results regarding two adjacent approximate voltage ranges that are vertically adjacent to the target approximate voltage range with $2^L$ reference times corresponding to $2^L$ specific voltage ranges and generates a target binary code of L bits indicating a target specific voltage range including the held voltage from the obtained time comparison results.

12 Claims, 11 Drawing Sheets

(51) Int. Cl.
*H03M 1/12* (2006.01)
*H03M 1/50* (2006.01)

(58) Field of Classification Search
USPC .................................................. 341/122, 155
See application file for complete search history.

(56) References Cited

U.S. PATENT DOCUMENTS

| | | | | |
|---|---|---|---|---|
| 8,482,446 B2* | 7/2013 | Haneda | ............... | H03M 1/1019 341/163 |
| 8,519,874 B2* | 8/2013 | Aruga | ................. | H03M 1/1038 341/120 |
| 9,013,345 B2* | 4/2015 | Segawa | ................... | H03M 1/40 341/161 |
| 9,219,489 B2* | 12/2015 | Jung | ..................... | H03M 1/0607 |
| 10,425,095 B1* | 9/2019 | Price | ..................... | H03M 1/144 |
| 2010/0013692 A1* | 1/2010 | Yamamoto | .......... | H03M 1/1245 341/158 |
| 2012/0075128 A1* | 3/2012 | Aruga | ................. | H03M 1/1019 341/110 |
| 2012/0112938 A1* | 5/2012 | Haneda | ............... | H03M 1/1019 341/110 |
| 2014/0210654 A1* | 7/2014 | Segawa | ................... | H03M 1/40 341/122 |
| 2015/0162926 A1* | 6/2015 | Jung | ..................... | H03M 1/468 341/122 |
| 2015/0372688 A1* | 12/2015 | Hashimoto | ........... | H03M 1/002 348/294 |

OTHER PUBLICATIONS

I-M. Yi, et al.,"A Time-Based Receiver With 2-Tap Decision Feedback Equalizer for Single-Ended Mobile DRAM Interface," IEEE Journal of Solid-State Circuits, vol. 53, No. 1. Jan. 2018. 11 pages.

* cited by examiner

| N(bits) | RELATED ART NUMBER OF CMPs | K(bits) | L(bits) | NUMBER OF CMPs | RATIO |
|---|---|---|---|---|---|
| 3 | 7 | 2 | 1 | 10 | 142.9% |
| 4 | 15 | 2 | 2 | 14 | 93.3% |
| 5 | 31 | 2 | 3 | 22 | 71.0% |
| 6 | 63 | 3 | 3 | 26 | 41.3% |
| 7 | 127 | 3 | 4 | 42 | 33.1% |
| 8 | 255 | 3 | 5 | 74 | 29.0% |
| 9 | 511 | 3 | 6 | 138 | 27.0% |
| 10 | 1023 | 3 | 7 | 266 | 26.0% |
| 11 | 2047 | 4 | 7 | 274 | 13.4% |
| 12 | 4095 | 4 | 8 | 530 | 12.9% |
| 13 | 8191 | 4 | 9 | 1042 | 12.7% |
| 14 | 16383 | 4 | 10 | 2066 | 12.6% |
| 15 | 32767 | 4 | 11 | 4114 | 12.6% |
| 16 | 65535 | 4 | 12 | 8210 | 12.5% |

Fig. 13

ANALOG-DIGITAL CONVERTER

This patent application is a national phase filing under section 371 of PCT/JP2019/040417, filed Oct. 15, 2019, which claims the priority of Japanese patent application no. 2018-203541, filed Oct. 30, 2018, each of which is incorporated herein by reference in its entirety.

TECHNICAL FIELD

The present invention relates to an analog-to-digital conversion technique that compares an analog input voltage with a plurality of different reference voltages in parallel, converts the obtained comparison result into digital data, and outputs the digital data.

BACKGROUND

A flash-type (parallel-type) analog-to-digital (AD) converter is an AD converter that analog-to-digital converts (hereinafter referred to as AD converts) an input voltage at a high speed and is widely used in optical receivers.

FIG. 14 is a block diagram illustrating a configuration of a flash AD converter of the related art.

FIG. 15 is an explanatory diagram illustrating a comparison operation of the flash AD converter of the related art.

FIG. 16 is an explanatory diagram illustrating a conversion rule of the flash AD converter of the related art.

As illustrated in FIG. 14, an N-bit analog-to-digital converter 50 of the related art includes a track-and-hold (T/H) circuit 51, a comparison circuit 52 having $2^N-1$ voltage comparators VCMP, a latch circuit 53 having $2^N-1$ SR latches, and an encoder 54 as main circuits (see, for example, Non Patent Literature 1).

The track-and-hold circuit 51 samples an analog input voltage $V_{IN}$ and then holds and outputs it according to a clock signal CK having a constant frequency. The comparison circuit 52 compares the held voltage $V_{OTH}$ which has been held and output by the track-and-hold circuit 51 with $2^N-1$ different reference voltages VR through $2^N-1$ voltage comparators VCMP in parallel and outputs the obtained voltage comparison results (OP, ON). The latch circuit 53 latches the $2^N-1$ voltage comparison results (OP, ON) output from the comparison circuit 52 through $2^N-1$ SR latches in parallel to generate $2^N-1$ digital bits DV. The encoder 54 encodes the $2^N-1$ DVs output from the latch circuit 53 and outputs a converted digital output $D_{OUT}$ including an N-bit binary code.

Each voltage comparator VCMP receives CK, $V_{OTH}$, and VR and generates a positive-side output OP and a negative-side output ON as a voltage comparison result. As illustrated in FIG. 15, both OP and ON are at level "0" during a period when CK is at level "0". When CK transitions to level "1", either OP or ON transitions to level "1" after being delayed by a delay time TD and the other remains at level "0". Therefore, when $V_{OTH}$ is less than VR ($V_{OTH}<$VR), ON is at level "1" and thus DV is at level "0". On the other hand, when $V_{OTH}$ is greater than VR ($V_{OTH}>$VR), OP is at level "1" and thus DV is at level "1".

In this way, $V_{OTH}$ is compared with $2^N-1$ different VRs in parallel by the $2^N-1$ voltage comparators VCMP and is assigned to $2^N$ voltage ranges. In each voltage range, the voltage value of $V_{OTH}$ is converted into an output $D_{OUT}$ including an N-bit binary code according to the conversion rule of FIG. 16. As a result, the converted digital output $D_{OUT}$ including an N-bit binary code is generated for each cycle of CK, thus enabling high speed operation.

CITATION LIST

Non Patent Literature

Non Patent Literature 1: Behzad Razavi, "The Flash ADC", A Circuit for All Seasons, IEEE SOLID-STATE CIRCUITS MAGAZINE, Summer 2017.

Non Patent Literature 2: Il-Min Yi et al., "A Time-Based Receiver With 2-Tap Decision Feedback Equalizer for Single-Ended Mobile DRAM Interface", IEEE JOURNAL OF SOLID-STATE CIRCUITS, VOL. 53, NO. 1, JANUARY 2018.

SUMMARY

Technical Problem

However, in such a technique of the related art, to perform AD conversion with high accuracy, it is necessary to set many voltage ranges according to the conversion rule of FIG. 16. Therefore, it is necessary to operate many CMPs in parallel during analog-to-digital conversion, causing a problem that the overall power consumption of the analog-to-digital converter increases.

The embodiments of the present invention are intended to solve such a problem and it is an object of embodiments of the present invention to provide an AD conversion technique capable of reducing the number of comparators operating during analog-to-digital conversion.

Means for Solving the Problem

To achieve the object, embodiments of the present invention provide an analog-to-digital converter configured to compare an analog input voltage $V_{IN}$ with a plurality of different reference voltages in parallel, convert obtained comparison results into a converted digital output $D_{OUT}$ of N bits (where N is an integer of 2 or more), and output the converted digital output $D_{OUT}$, the analog-to-digital converter including a track-and-hold circuit configured to sample and hold the analog input voltage $V_{IN}$ and output a held voltage $V_{OTH}$ obtained by sampling and holding the analog input voltage $V_{IN}$, a first comparison circuit including $2^K+2$ voltage comparators VCMP[n] (where K is an integer of 1 or more and less than N and n is an integer of 0 to $2^K+1$), the first comparison circuit being configured to compare, at each of the voltage comparators VCMP[n], reference voltages VR[n] assigned to the respective voltage comparators VCMP[n] with the held voltage $V_{OTH}$ to output $2^K+2$ voltage comparison results, a latch circuit configured to latch the voltage comparison results to generate a thermometer code indicating a target approximate voltage range A[x] (where x is an integer of 1 to $2^K$) including the held voltage $V_{OTH}$ among $2^K$ preset approximate voltage ranges A, a second comparison circuit including $2^K$ time comparison circuits TDS[m] (where m is an integer of 1 to $2^K$) corresponding to the respective approximate voltage ranges A, the second comparison circuit being configured such that a target time comparison circuit TDS[x] corresponding to the target approximate voltage range A[x] among the time comparison circuits TDS[m] compares a comparison operation time difference TDD included in voltage comparison results, among the voltage comparison results output from the first comparison circuit, regarding two adjacent approximate voltage ranges A[x+1] and A[x−1] that are vertically adjacent to the target approximate voltage range A[x] with $2^L$ reference times TR (where L=N−K) corresponding to $2^L$ specific voltage ranges B and generates a target binary code of L bits indicating a target specific voltage range B[x] including the held voltage $V_{OTH}$ within the target approximate voltage range A[x] from $2^L$ obtained time comparison results to output full binary codes of L×$2^K$ bits that combine non-target binary codes of L bits output from $2^K$−1 time comparison circuits TDS[y] other than the target time comparison circuit TDS[x] and the target binary code, and an output circuit configured to generate upper K-bit binary data of the converted digital output Dour based on the thermometer code output from the latch circuit and generate lower L-bit binary data of the converted digital output $D_{OUT}$ based on the full binary codes output from the second comparison circuit.

In an exemplary configuration of the above analog-to-digital converter according to embodiments of the present invention, the first comparison circuit is configured to compare, at each of the voltage comparators VCMP[n], the reference voltages VR[n] assigned to the respective voltage comparators VCMP[n] with the held voltage $V_{OTH}$ to output a positive-side output OP[n] indicating that $V_{OTH}$>VR[n] and a negative-side output ON[n] indicating that $V_{OTH}$<VR[n] as the voltage comparison results.

In the exemplary configuration of the above analog-to-digital converter according to embodiments of the present invention, the latch circuit includes $2^K$+2 latches L[n] configured to perform latch operations based on the positive-side output OP[n] and the negative-side output ON[n] to generate the thermometer code of $2^K$+2 bits based on obtained latch outputs.

In the exemplary configuration of the above analog-to-digital converter according to embodiments of the present invention, each of the time comparison circuits TDS[m] includes $2^L$ time comparators TCMP[i] (where i is an integer of 1 to $2^L$) and is configured such that, when a time comparison circuit TDS[m] among the time comparison circuits TDS[m] is the target time comparison circuit TDS[x], the time comparison circuit TDS[m] compares, at the time comparators TCMP[i], the comparison operation time difference TDD which is a time difference between the positive-side output OP[m+1] of a voltage comparator VCMP[m+1] among the voltage comparators VCMP[n] and the negative-side output ON[m−1] of a voltage comparator VCMP[m−i] among the voltage comparators VCMP[n] with the reference times TR[i] assigned to the respective time comparators TCMP[i] to generate the target binary code of L bits.

In the exemplary configuration of the above analog-to-digital converter according to embodiments of the present invention, each of the time comparators TCMP[i] includes a delay circuit configured to delay one of the positive-side output OP[m+1] and the negative-side output ON[m−1] that are input by a reference time TR[i] among the reference times TR[i] and a latch circuit configured to perform a latch operation based on the positive-side output OP[m+1] and the negative-side output ON[m−1] output from the delay circuit to output 1-bit binary data $D_T$[i] indicating a time comparison result between the comparison operation time difference TDD and the reference time TR[i].

In the exemplary configuration of the above analog-to-digital converter according to embodiments of the present invention, each of the time comparison circuits TDS[m] includes a switching circuit configured to perform switching control of an input of the negative-side output ON[m−1] to a time comparator TCMP[i] among the time comparators TCMP[i] based on the positive-side output OP[m+1] of the voltage comparator VCMP[m+1.] while performing switching control of an input of the positive-side output OP[m+1] to the time comparator TCMP[i] based on the negative-side output ON[m−1] of the voltage comparator VCMP[m−1].

Effects of Embodiments of the Invention

According to embodiments of the present invention, the converted digital output of N bits (where N=K+L) indicates the held voltage can be obtained only by operating the $2^K$+2 voltage comparators and the $2^L$ time comparators during analog-to-digital conversion. Thus, as compared with when $2^N$−1 voltage comparators operate in parallel, the number of comparators operating during analog-to-digital conversion can be effectively reduced, and as a result, the overall power consumption of the analog-to-digital converter can be significantly reduced.

Further, good linearity can be achieved for the voltage-to-time conversion characteristics used when converting the input voltage differences between the held voltage and the reference voltages into the delay times. Thus, restrictions on the resolution of the voltage-to-time conversion characteristics as well as on the conversion speed thereof can be reduced, $2^L$ which is the number of specific voltage ranges that can be set within an approximate voltage range can be increased, and $2^K$ which is the number of voltage comparators can be more effectively reduced.

BRIEF DESCRIPTION OF THE DRAWINGS

FIG. 13 is an explanatory diagram illustrating the number of comparators operating during analog-to-digital conversion.

DETAILED DESCRIPTION OF ILLUSTRATIVE EMBODIMENTS

Next, embodiments of the present invention will be described with reference to the drawings.

Analog-to-Digital Converter

Figure 1:
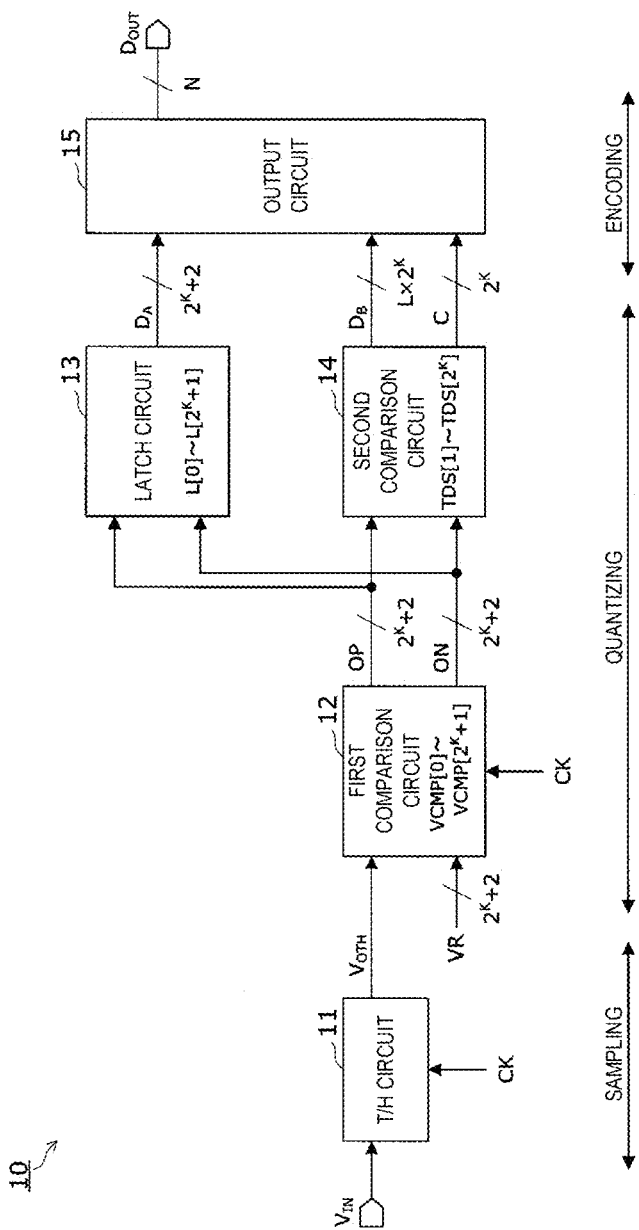
FIG. 1 is a block diagram illustrating a configuration of an analog-to-digital converter.

First, an analog-to-digital converter 10 according to the present embodiment will be described with reference to FIG. 1. FIG. 1 is a block diagram illustrating a configuration of the analog-to-digital converter.

The analog-to-digital converter 10 is an AD converter that compares an analog input voltage $V_{IN}$ with a plurality of different reference voltages VR in parallel and converts the obtained comparison result into an N-bit converted digital output $D_{OUT}$ (where N is an integer of 2 or more) and then outputs the N-bit converted digital output $D_{OUT}$.

As illustrated in FIG. 1, the analog-to-digital converter 10 includes a track-and-hold (T/H) circuit 11, a first comparison circuit 12, a latch circuit 13, a second comparison circuit 14, and an output circuit 15 as main circuits.

The analog input voltage $V_{IN}$ is sampled by the track-and-hold circuit 11, quantized by the first comparison circuit 12, the latch circuit 13, and the second comparison circuit 14, and then encoded into a converted digital output $D_{OUT}$ and output by the output circuit 15.

Overview of Embodiments of the Present Invention

Next, an overview of embodiments of the present invention will be described. Commonly, an N-bit analog-to-digital converter presets $2^N$ voltage ranges and outputs a digital code indicating a voltage range including the analog input voltage $V_{IN}$ as a converted digital output $D_{OUT}$.

The analog-to-digital converter 10 according to embodiments of the present invention presets $2^K$ (where K is an integer of 1 or more and less than N) approximate voltage ranges A[m] (where m is an integer of 1 to $2^K$) while setting $2^L$ (L=N−K) specific voltage ranges B[i] for each A[m], and the first comparison circuit 12 identifies an approximate voltage range A[m] including the analog input voltage $V_{IN}$, that is, a target approximate voltage range A[x], and then the second comparison circuit 14 identifies a specific voltage range B[x] including the analog input voltage $V_{IN}$ within the target approximate voltage range A[x].

When identifying the specific voltage range B[x], the analog-to-digital converter 10 according to embodiments of the present invention compares the analog input voltage $V_{IN}$ with the specific voltage ranges B[i] in the time domain rather than in the voltage domain.

Here, time-domain comparison is performed using voltage-to-time conversion based on relationships between input voltage differences ΔV between the analog input voltage $V_{IN}$ and reference voltages VR in the voltage comparators VCMP of the first comparison circuit 12 and delay times ΔT occurring in their comparison operations.

This eliminates the need to process the analog input voltage $V_{IN}$ and allows the second comparison circuit 14 to identify a specific voltage range B including the analog input voltage $V_{IN}$ based on voltage comparison results obtained by the first comparison circuit 12, such that the circuit configuration can be simplified. The relationships between the voltage differences and the delay times and voltage-to-time conversion will be described in detail in the principle of embodiments of the present invention which will be described below.

Circuit Configuration of Analog-to-Digital Converter

Next, each circuit included in the analog-to-digital converter 10 will be described with reference to FIG. 1.

The track-and-hold circuit 11 samples and holds an analog input voltage $V_{IN}$ and outputs the obtained held voltage $V_{OTH}$.

The first comparison circuit 12 includes $2^K+2$ voltage comparators VCMP[0] to VCMP[$2^K+1$] (where K is an integer of 1 or more and less than N). The first comparison circuit 12 compares the held voltage $V_{OTH}$ which is held and output by the track-and-hold circuit 11 with $2^K+2$ reference voltages VR[0] to VR[$2^K+1$] in parallel through the voltage comparators VCMP[n] (where n is an integer of 0 to $2^K+1$) and outputs $2^K+2$ positive-side outputs OP[0] to OP[$2^K+1$] and $2^K+2$ negative-side outputs ON[0] to ON[$2^K+1$] which are voltage comparison results.

The latch circuit 13 includes $2^K+2$ latches L[0] to L[$2^K+1$]. The latch circuit 13 causes the latches L to perform latch operations based on the positive-side outputs OP[0] to OP[$2^K+1$] and the negative-side outputs ON[0] to ON[$2^K+1$] output from the first comparison circuit 12 to generate a $2^K+2$-bit thermometer code $D_A$ indicating a target approximate voltage range A[x] (where x is an integer of 1 to $2^K$) including the held voltage $V_{OTH}$ among $2^K$ preset approximate voltage ranges A[1] to [$2^K$].

Figure 14:
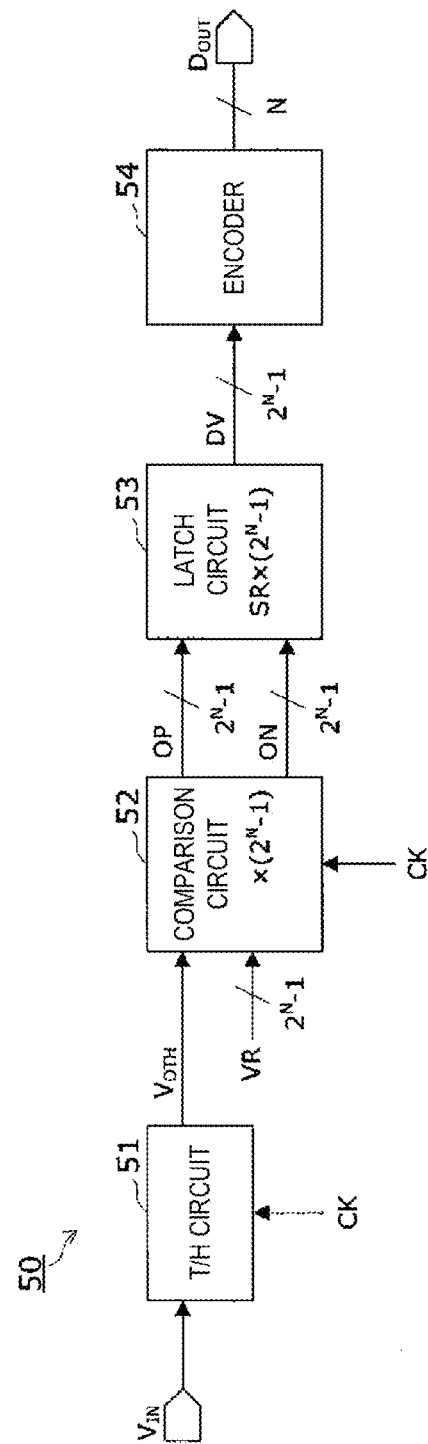
FIG. 14 is a block diagram illustrating a configuration of a flash AD converter of the related art.
Figures 15, 16:
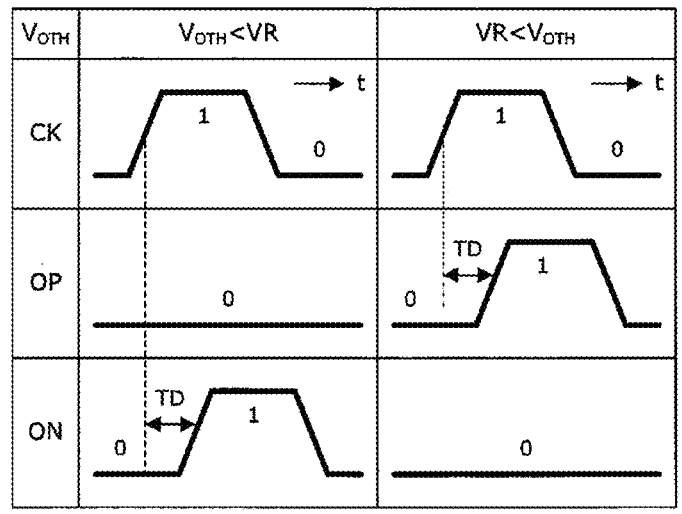
FIG. 15 is an explanatory diagram illustrating a comparison operation of the flash AD converter of the related art.
FIG. 16 is an explanatory diagram illustrating a conversion rule of the flash AD converter of the related art.

For example, SR latches using NAND gate circuits, similar to the latch circuit 53 of FIG. 14 described above, may be used as the latches L of the latch circuit 13, but latches having another circuit configuration may also be used as long as they perform SR latch operations. Here, a latch L[n] corresponding to a reference voltage VR[n] performs a latch operation using voltage comparison results regarding reference voltages VR[n−1] and VR[n+1] which are located alternately with the reference voltage VR[n] interposed therebetween, that is, which are adjacent to the reference voltage VR[n], similar to the time comparison circuit TDS which will be described below.

Specifically, the SR latch[n] performs a latch operation based on a positive-side output OP[n−1] input through its S input terminal which is a voltage comparison result regarding the reference voltage VR[n−1] and a negative-side output ON[n+1] input through its R input terminal which is a voltage comparison result regarding the reference voltage VR[n+1] to output 1-bit binary data indicating the result of voltage comparison between the held voltage $V_{OTH}$ and the reference voltage VR[n].

The second comparison circuit 14 includes $2^K$ time comparison circuits TDS[1] to TDS[$2^K$] corresponding to the respective approximate voltage ranges A. The second comparison circuit 14 generates an L-bit target binary code $D_B[x]$ indicating a target specific voltage range B[x] including the held voltage $V_{OTH}$ among the $2^L$ (L=N−K) specific voltage ranges B[1] to [$2^L$] set in the target approximate voltage range A[x] through a target time comparison circuit TDS[x] corresponding to the target approximate voltage range A[x] among those time comparison circuits TDS and outputs full binary codes $D_B$ of L×$2^K$ bits that combine the generated L-bit target binary code $D_B[x]$ and non-target L-bit binary codes $D_B[y]$ generated by $2^K-1$ time comparison circuits TDS[y] other than the target time comparison circuit TDS[x].

The output circuit 15 generates binary data of upper K bits of the converted digital output $D_{OUT}$ based on the $2^K+2$-bit thermometer code $D_A$ output from the latch circuit 13 and generates lower L bits of the converted digital output $D_{OUT}$ based on the full binary codes $D_B$ of $L \times 2^K$ bits output from the second comparison circuit 14 to generate an N-bit converted digital output $D_{OUT}$ indicating the analog input voltage $V_{IN}$.

Principle of Embodiments of the Present Invention

Figure 2:
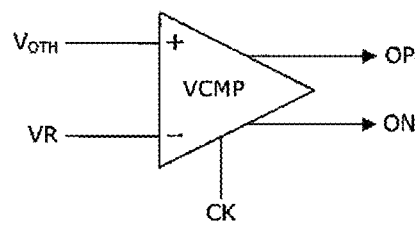
FIG. 2 is a circuit diagram illustrating a typical voltage comparator having positive-side and negative-side output terminals.
Figure 3:
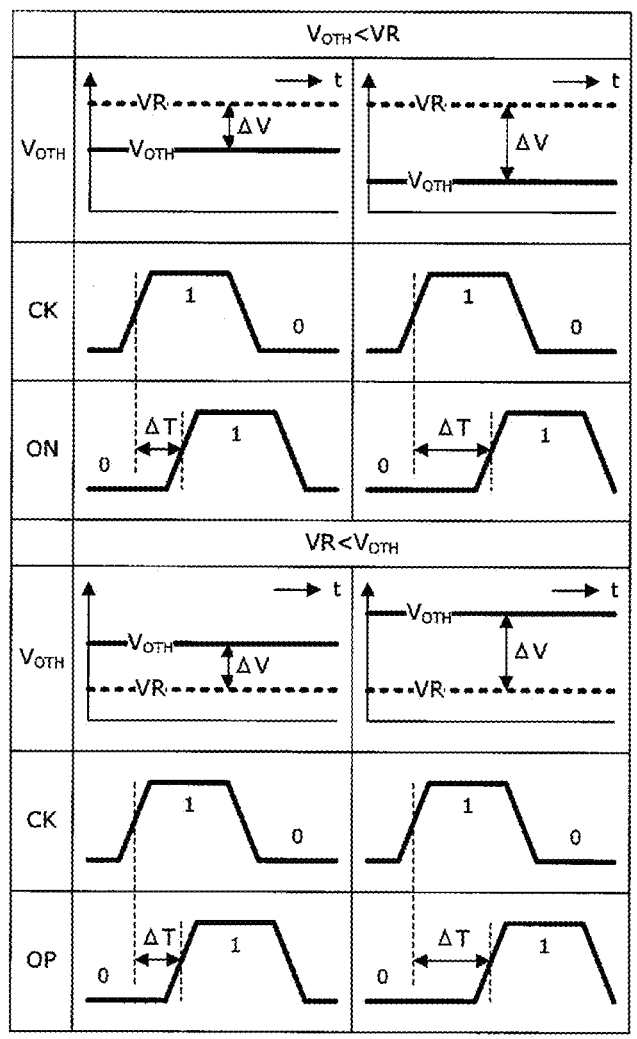
FIG. 3 is an explanatory diagram for explaining the operation of the voltage comparator illustrated in FIG. 2.

Next, the principle of embodiments of the present invention will be described. FIG. 2 is a circuit diagram illustrating a typical voltage comparator having positive-side and negative-side output terminals. FIG. 3 is an explanatory diagram illustrating the operation of the voltage comparator of FIG. 2.

The first comparison circuit 12 compares the held voltage $V_{OTH}$ with the reference voltages VR using typical voltage comparators VCMP which each output a positive-side output OP and a negative-side output ON as illustrated in FIG. 2. Here, each voltage comparator VCMP has delay characteristics such that a delay time $\Delta T$ occurs during the comparison operation by a length corresponding to the input voltage difference $\Delta V$ ($=|V_{OTH}-VR|$) between the held voltage $V_{OTH}$ and the reference voltage VR (see, for example, Non Patent Literature 2).

As illustrated in FIG. 3, for example, when $V_{OTH}<VR$, the positive-side output OP becomes level "1" and the negative-side output ON becomes level "0". Here, the rise of the positive-side output OP is delayed with respect to the rise of the clock signal CK used for sampling in the track-and-hold circuit 11 by a delay time $\Delta T$. This delay time $\Delta T$ monotonically increases as the input voltage difference $\Delta V$ ($=|V_{OTH}-VR|$) between the held voltage $V_{OTH}$ and the reference voltage VR increases due to the delay characteristics described above.

On the other hand, when $V_{OTH}<VR$, the positive-side output OP becomes level "0" and the negative-side output ON becomes level "1". Here, the rise of the negative-side output ON is delayed with respect to the rise of the clock signal CK by a delay time $\Delta T$. This delay time $\Delta T$ monotonically increases as the input voltage difference $\Delta V$ ($=|V_{OTH}-VR|$) between the held voltage $V_{OTH}$ and the reference voltage VR increases.

Figure 4:
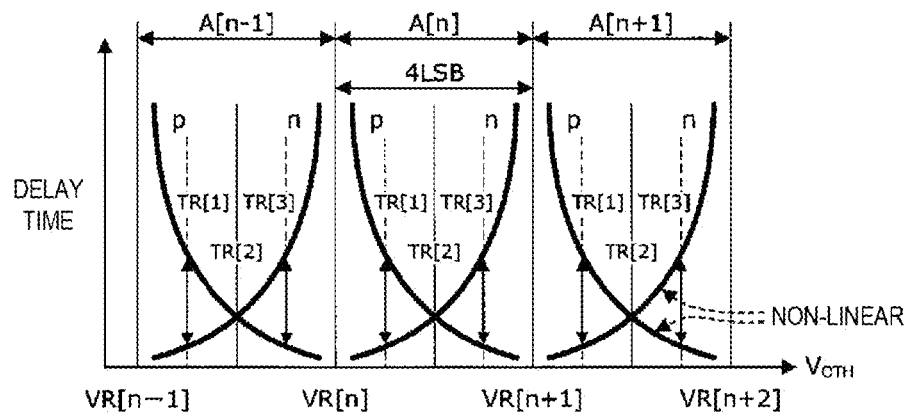
FIG. 4 is a graph illustrating the relationships between the input voltage differences of (consecutive) voltage comparators and delay times.

FIG. 4 is a graph illustrating the relationships between the input voltage differences of (consecutive) voltage comparators and delay times. As illustrated in FIG. 4, for example, when the held voltage $V_{OTH}$ is compared with the reference voltage VR[n+1] by the voltage comparator VCMP[n+1], the delay time $\Delta T[n+1]$ increases as the voltage value of $V_{OTH}$ decreases toward VR[n] and away from VR[n+1] based on voltage-to-time conversion characteristics p. On the other hand, when the held voltage $V_{OTH}$ is compared with the reference voltage VR[n] by the voltage comparator VCMP[n] that is consecutive to the voltage comparator VCMP[n+1], the delay time $\Delta T[n]$ increases as $V_{OTH}$ increases toward VR[n+1] and away from VR[n] based on voltage-to-time conversion characteristics n.

Thus, paying attention to a comparison operation time difference TDD=$\Delta T[n+1]-\Delta T[n]$ between the delay times $\Delta T[n+1]$ and $\Delta T[n]$, as the held voltage $V_{OTH}$ increases from VR[n] to VR[n+1], TDD gradually increases from a negative value to a positive value, and TDD=0 at the intermediate position. Therefore, if a plurality of specific voltage ranges B[i] are set between VR[n] and VR[n+1], the position of the held voltage $V_{OTH}$ between VR[n] and VR[n+1] can be identified based on the comparison operation time difference TDD. As a result, the analog input voltage $V_{IN}$ and the specific voltage range B[i] can be compared in the time domain.

FIG. 4 illustrates an example in which 2 bits starting from the least significant bit (LSB) of the converted digital output $D_{OUT}$, that is, 2 LSBs, are assigned to one approximate voltage range A, such that 4 specific voltage ranges B are set between VR[n] and VR[n+1]. When reference times TR[1], TR[2], and TR[3] are preset in correspondence with three specific reference voltages corresponding to the boundaries of the specific voltage ranges B and compared with a comparison operation time difference TDD obtained from the actual held voltage $V_{OTH}$, it is possible to identify a specific voltage range B including the held voltage $V_{OTH}$.

However, the voltage-to-time conversion characteristics p and n change exponentially and are non-linear in a section used for the voltage-to-time conversion as illustrated in FIG. 4. Such non-linearity limits the resolution of the voltage-to-time conversion characteristics. This is because the slope of the voltage-to-time conversion characteristics greatly changes as the delay time $\Delta T$ decreases, such that the output pulse width of the voltage comparator VCMP is narrowed, and as a result, the conversion speed and resolution are limited. Thus, $2^L$ which is the number of specific voltage ranges B that can be set within an approximate voltage range A cannot be increased and $2^K$ which is the number of voltage comparators VCMP cannot be effectively reduced.

Here, it can be seen from FIG. 4 that the slope of the voltage-to-time conversion characteristics changes depending on the length of the delay time $\Delta T$, and as the delay time $\Delta T$ increases, the slope of the voltage-to-time conversion characteristics becomes gentler, achieving linearity. On the other hand, the length of the delay time $\Delta T$ increases as the input voltage difference $\Delta V$ between the held voltage $V_{OTH}$ and the reference voltage VR[n] increases. For example, when the held voltage $V_{OTH}$ is compared with the reference voltage VR[n−1], a delay time $\Delta T[n-1]$ longer than a delay time $\Delta T[n]$ obtained when compared with the reference voltage VR[n] is obtained and the slope of the voltage-to-time conversion characteristics becomes gentle.

Focusing on such voltage-to-time conversion characteristics and the relationships between the delay times and the input voltage differences regarding the voltage comparators VCMP, embodiments of the present invention use a comparison operation time difference TDD[n−1, n+1] between the delay times $\Delta T[n-1]$ and $\Delta T[n+1]$ which is associated with comparison of the held voltage $V_{OTH}$ with the reference voltages VR[n−1] and VR[n+1], rather than a comparison operation time difference TDD[n, n+1] between the delay times $\Delta T[n]$ and $\Delta T[n+1]$ which is associated with comparison of the held voltage $V_{OTH}$ with the reference voltages VR[n] and VR[n+1], to identify a specific voltage range B including the held voltage $V_{OTH}$ within the approximate voltage range A[n].

Figure 5:
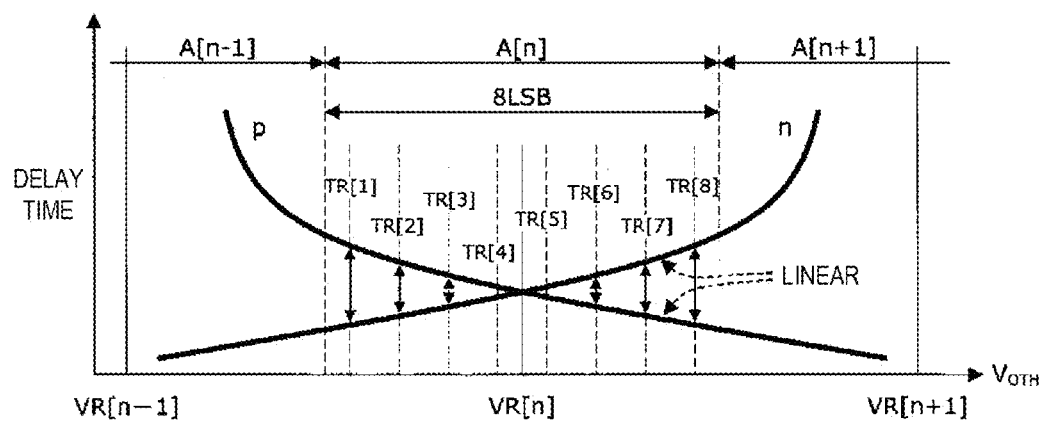
FIG. 5 is a graph illustrating the relationships between the input voltage differences of (alternate) voltage comparators and delay times.

FIG. 5 is a graph illustrating the relationships between the input voltage differences of (alternate) voltage comparators and delay times. Here, as compared with FIG. 4, FIG. 5 illustrates voltage-to-time conversion characteristics p and n when the held voltage $V_{OTH}$ is compared with two reference voltages VR[n−1] and VR[n+1] which are located alternately with the reference voltage VR[n] interposed therebetween (which are adjacent to the reference voltage VR[n] at both sides).

In this case, because the reference voltages are such that VR[n−1]<VR[n], the delay times are such that $\Delta T[n-1]>\Delta T[n]$ and the comparison operation time differences are such that TDD[n−1, n+1]>TDD[n, n+1]. Thus, the slopes of the voltage-to-time conversion characteristics p and n become gentle and good linearity is achieved in a section used for the voltage-to-time conversion in the approximate voltage range A[n] as illustrated in FIG. 5.

FIG. 5 illustrates an example in which eight LSBs of the converted digital output $D_{OUT}$ are assigned to one approximate voltage range A and eight specific voltage ranges B are set across VR[n]. When reference times TR[1], TR[2], and TR[3] are preset in correspondence with eight specific reference voltages corresponding to the boundaries of the specific voltage ranges B and compared with a comparison operation time difference TDD obtained from the actual held voltage $V_{OTH}$, it is possible to identify a specific voltage range B including the held voltage $V_{OTH}$. Thus, $2^L$ which is the number of specific voltage ranges B that can be set within an approximate voltage range A can be increased and $2^K$ which is the number of voltage comparators VCMP can be effectively reduced as compared with the example of FIG. 4.

Time Comparison Circuit

Figure 6:
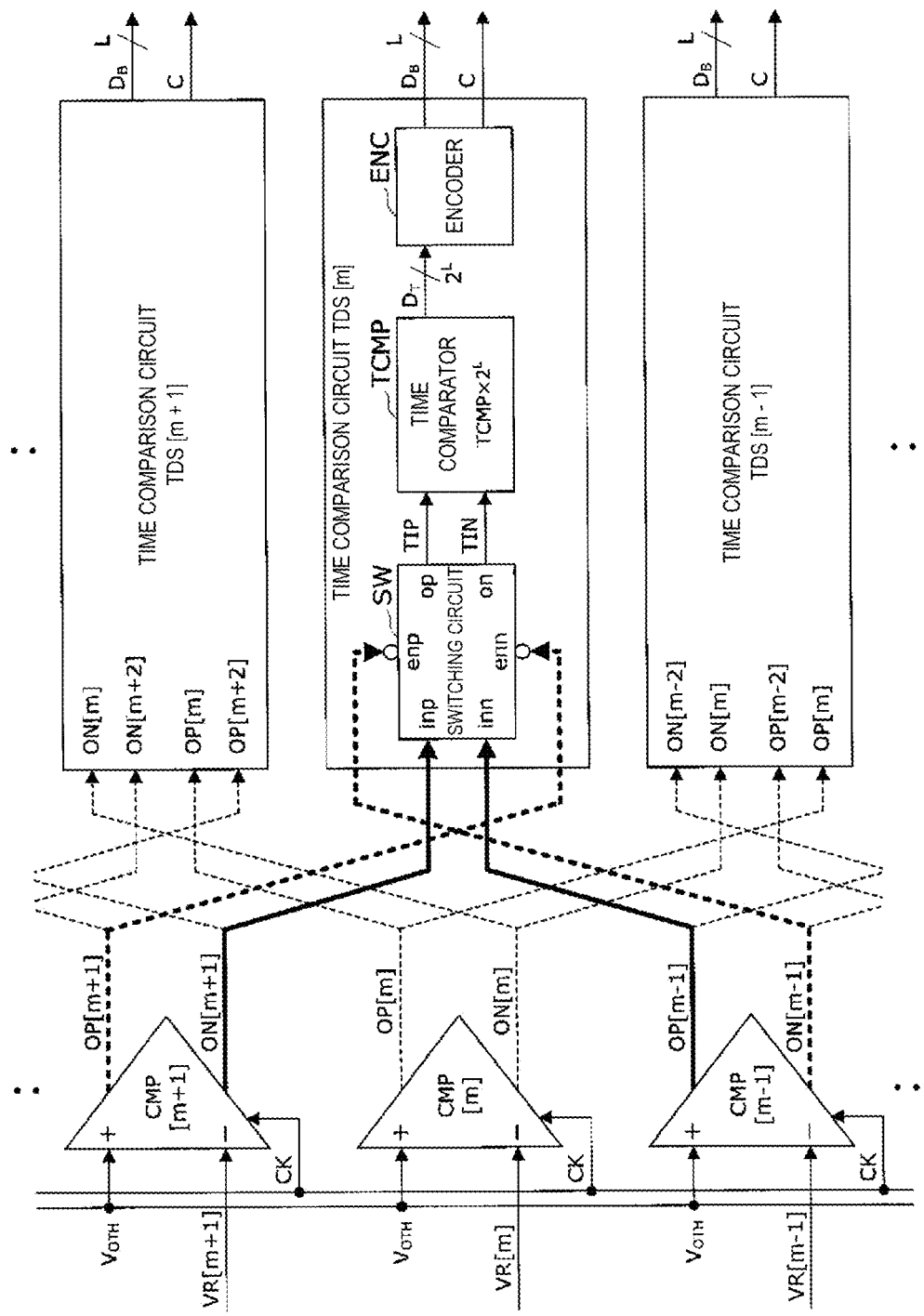
FIG. 6 is a circuit diagram illustrating an exemplary configuration of a time comparison circuit.

Next, the time comparison circuits TDS will be described in detail with reference to FIG. 6. FIG. 6 is a circuit diagram illustrating an exemplary configuration of each time comparison circuit.

As illustrated in FIG. 6, each time comparison circuit TDS[m] includes a switching circuit SW, $2^L$ time comparators TCMP[1] to TCMP[$2^L$], and an encoder ENC.

The switching circuit SW performs switching control of an input of the negative-side output ON[m−1] to the time comparator TCMP[i] based on the positive-side output OP[m+1] of the voltage comparator VCMP[m+1] while performing switching control of an input of the positive-side output OP[m+1] to the time comparator TCMP[i] based on the negative-side output ON[m−1] of the voltage comparator VCMP[m−1].

The negative-side output ON[m+1] of the voltage comparator VCMP[m+1] is input to a positive-side input terminal inp of the switching circuit SW and the positive-side output OP[m−1] of the voltage comparator VCMP[m−1] is input to a negative-side input terminal inn thereof.

The negative-side output ON[m−1] of the voltage comparator VCMP[m−1] is input to a positive-side enable terminal enp of the switching circuit SW and the positive-side output OP[m+1] of the voltage comparator VCMP[m+1] is input to a negative-side enable terminal enn thereof.

Figure 7:
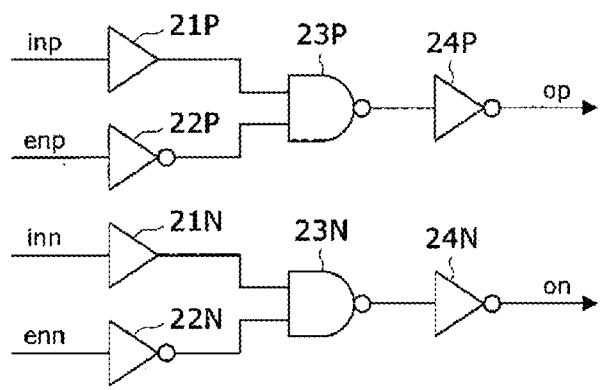
FIG. 7 is an exemplary circuit configuration of a switching circuit.

FIG. 7 illustrates an exemplary circuit configuration of the switching circuit. This switching circuit SW includes buffers 21P and 21N, inverters 22P, 22N, 24P and 24N, and NANDs 23P and 23N.

An input terminal of the buffer 21P is connected to the positive-side input terminal inp and an output terminal of the buffer 21P is connected to one input terminal of the NAND 23P. An input terminal of the inverter 22P is connected to the positive-side enable terminal enp and an output terminal of the inverter 22P is connected to the other input terminal of the NAND 23P.

An input terminal of the buffer 21N is connected to the negative-side input terminal inn and an output terminal of the buffer 21N is connected to one input terminal of the NAND 23N. An input terminal of the inverter 22N is connected to the negative-side enable terminal enn and an output terminal of the inverter 22N is connected to the other input terminal of the NAND 23N.

An output terminal of the NAND 23P is connected to an input terminal of the inverter 24P and an output terminal of the inverter 24P is connected to an output terminal op of the switching circuit SW.

An output terminal of the NAND 23N is connected to an input terminal of the inverter 24N and an output terminal of the inverter 24N is connected to an output terminal on of the switching circuit SW.

When the positive-side enable terminal enp is enabled, a signal input to the positive-side input terminal inp, that is, the negative-side output ON[m−1] of the voltage comparator VCMP[m−1], is output and transferred to each time comparator TCMP as a voltage comparison result TIP. When the positive-side enable terminal enp is disabled, a signal of "0" is fixedly output as the voltage comparison result TIP regardless of the input value to the positive-side input terminal inp.

When the negative-side enable terminal enn is enabled, a signal input to the negative-side input terminal inn, that is, the positive-side output OP[m−1] of the voltage comparator VCMP[m−1], is output and transferred to each time comparator TCMP as a voltage comparison result TIN. When the negative-side enable terminal enn is disabled, a signal of "0" is fixedly output as the voltage comparison result TIN regardless of the input value to the negative-side input terminal inn.

Thus, when both the positive-side enable terminal enp and the negative-side enable terminal enn are enabled, it is determined that the time comparison circuit is a target time comparison circuit TDS[x], and voltage comparison results TIP and TIN are output from the switching circuit SW.

When the voltage comparison results TIP and TIN from the switching circuit SW are input to each time comparator TCMP[i], the time comparator TCMP[i] compares a comparison operation time difference TDD which is the time difference between the positive-side output OP[m+1] of the voltage comparator VCMP[m+1] and the negative-side output ON[m−1] of the voltage comparator VCMP[m−1] based on the voltage comparison results TIP and TIN with a reference time TR[i] assigned to the time comparator TCMP[i] to output 1-bit binary data $D_T[i]$. When the voltage comparison results TIP and TIN are not input, the time comparator TCMP[i] outputs 1-bit binary data $D_T[i]$ indicating "0".

That is, the time comparator TCMP performs the time comparison operation when the voltage comparison results TIP and TIN are output from the switching circuit SW and does not perform the time comparison operation when the voltage comparison results TIP and TIN are not output. This allows only the target time comparison circuit TDS[x] to perform the time comparison operation while preventing time comparison circuits TDS[y] other than the target time comparison circuit TDS[x] from performing the time comparison operation. Thus, the number of comparators operating during analog-to-digital conversion can be reduced, and as a result, the overall power consumption of the analog-to-digital converter 10 can be reduced.

Figure 8:
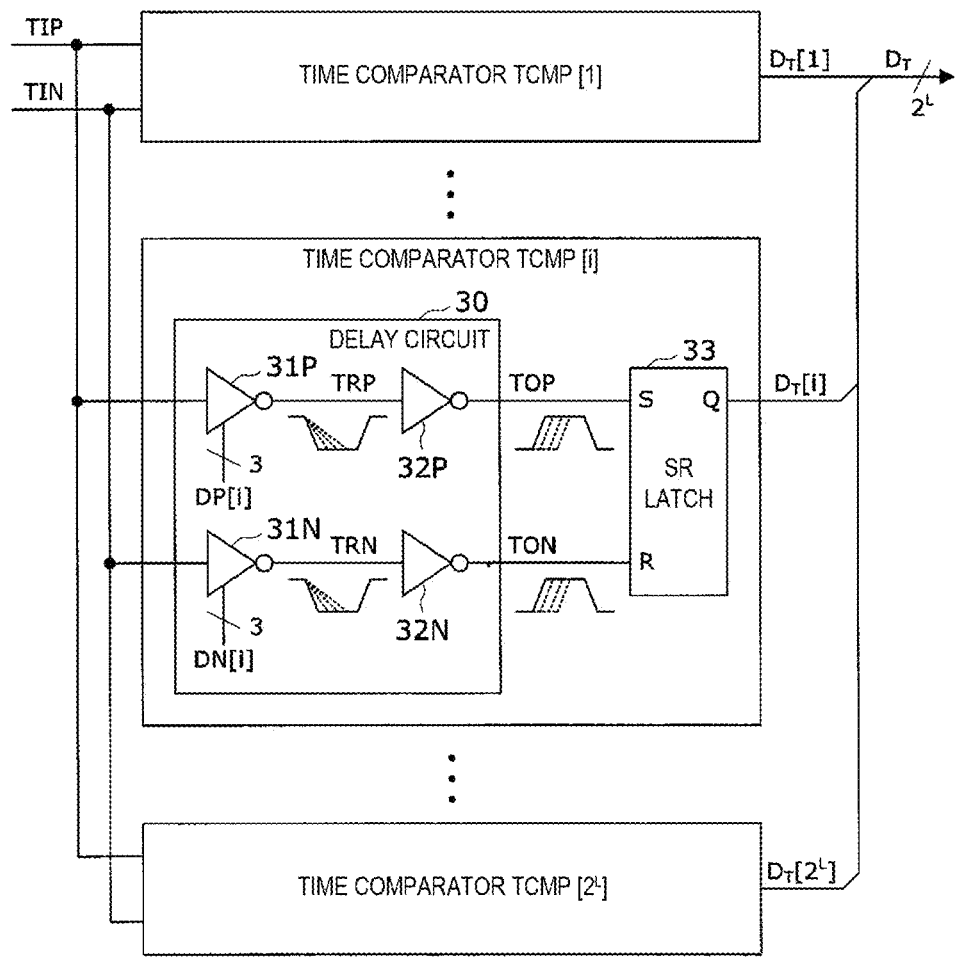
FIG. 8 is an exemplary circuit configuration of each time comparator.

FIG. 8 illustrates an exemplary circuit configuration of each time comparator. Each time comparator TCMP includes a delay circuit 30 and an SR latch 33.

The delay circuit 30 includes variable delay circuits 31P and 31N and inverters 32P and 32N.

The variable delay circuit 31P outputs a delay signal TRP obtained by delaying the input voltage comparison result TIP by a reference time TR[i] designated by a delay instruction DP[i]. The variable delay circuit 31N outputs a delay signal TRN obtained by delaying the input voltage comparison result TIN by a reference time TR[i] designated by a delay instruction DN[i]. The delay instructions DP[i] and DN[i] may be fixed signals, but a control circuit may be provided to perform the change control.

The inverters 32P and 32N waveform-shape the input delay signals TRP and TRN and output them as delay signals TOP and TON.

The SR latch 33 performs a latch operation based on the delay signal TOP from the variable delay circuit 31P which has been input to the S input terminal via the inverter 32P and the delay signal TON from the variable delay circuit 31N which has been input to the R input terminal via the inverter 32N to output 1-bit binary data $D_T[i]$. Here, due to this latch operation, the binary data $D_T[i]$ output from the output terminal Q becomes level "1" if the delay signal TOP at the S input terminal rises earlier than the delay signal TON at the R input terminal. On the other hand, the binary data $D_T[i]$ output from the output terminal Q becomes level "0" if the delay signal TOP at the S input terminal rises later than the delay signal TON at the R input terminal.

Thus, for example, it is understood that the comparison operation time difference TDD is longer than the reference time TR[i] when the voltage comparison result TIN has been delayed with respect to the voltage comparison result TIP by the comparison operation time difference TDD and the binary data $D_T[i]$ that the time comparator TCMP[i] has obtained by delaying the voltage comparison result TIP by the reference time TR[i] indicates "1". It is also understood that the comparison operation time difference TDD is shorter than the reference time TR[i+1] when the binary data $D_T[i+1]$ that the time comparator TCMP[i+1] has obtained by delaying the voltage comparison result TIP by the reference time TR[i+1] longer than the reference time TR[i] indicates "0". Thus, in this example, the comparison operation time difference TDD is located between the reference times TR[i] and TR[i+1].

The encoder ENC encodes all binary data $D_T[1]$ to $D_T[2^L]$ output from the time comparators TCMP[1] to TCMP[$2^L$], outputs an L-bit binary code $D_B[m]$, and outputs 1 carry bit C[m] indicating "1" or "0" depending on whether all bits of the obtained binary code $D_B[m]$ indicate "1".

Output Circuit

Figures 9, 10:
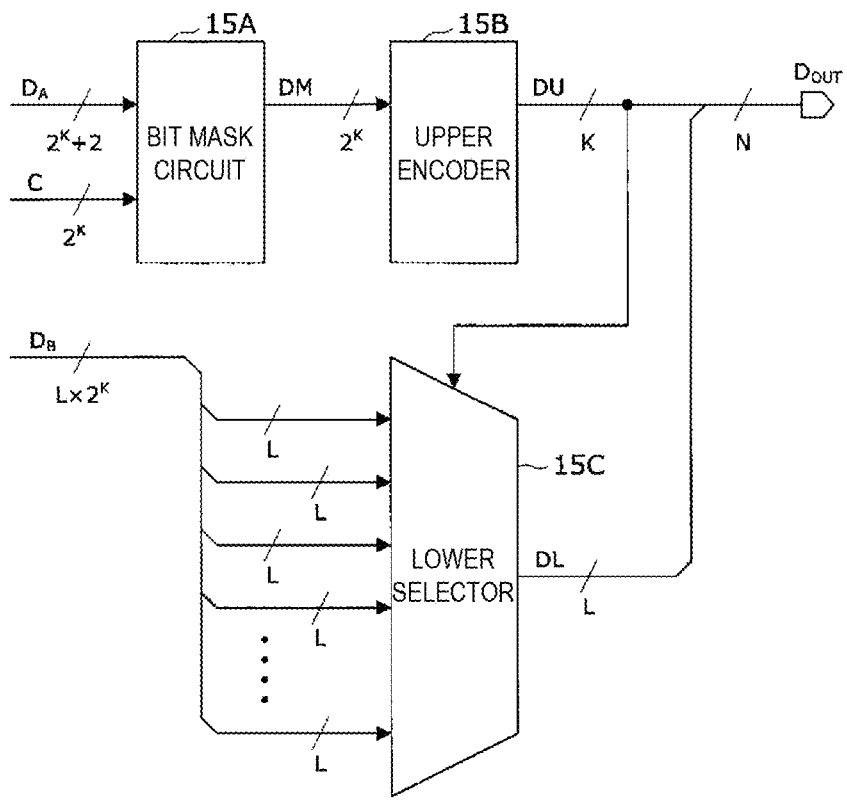
FIG. 9 is a circuit diagram illustrating an exemplary configuration of an output circuit.
FIG. 10 is an exemplary operation of a bit mask circuit.

Next, the output circuit 15 will be described in detail with reference to FIG. 9. FIG. 9 is a circuit diagram illustrating an exemplary configuration of the output circuit.

As illustrated in FIG. 9, the output circuit 15 includes a bit mask circuit 15A, an upper encoder 15B, and a lower selector 15C.

The bit mask circuit 15A masks the $2^K+2$-bit thermometer code $D_A$ output from the latch circuit 13 with $2^K$ carry bits C output from the time comparison circuits TDS of the second comparison circuit 14 to output a $2^K$-bit masked thermometer code DM.

The upper encoder 15B encodes the masked thermometer code DM from the bit mask circuit 15A to generate and output K-bit upper binary data DU of the N-bit converted digital output $D_{OUT}$.

The lower selector 15C selects an L-bit binary code based on the K-bit upper binary data DU from full binary codes $D_B$ of $2^K \times L$ bits output from the time comparison circuits TDS of the second comparison circuit 14 to generate and output L-bit lower binary data DL of the N-bit converted digital output $D_{OUT}$.

FIG. 10 is an explanatory diagram illustrating the operation of the bit mask circuit. As illustrated in FIG. 2 described above, the voltage comparators VCMP output positive-side outputs OP and negative-side outputs ON. Thus, when the outputs OP and ON are latched by the latch circuit 13, two bits of the thermometer code $D_A$ corresponding to two adjacent reference voltages VR[n] and VR[n+1] are simultaneously "1".

For example, when the held voltage $V_{OTH}$ is located between the reference voltages VR[n] and VR[n+1], the positive-side outputs OP of voltage comparators VCMP[n], VCMP[n−1], . . . , VCMP[0] which use reference voltages VR equal to or lower than the reference voltage VR[n] are all "1". The negative-side outputs ON of voltage comparators VCMP[n+1], VCMP[n+2], . . . , VCMP[$2^K$+1] which use reference voltages VR equal to or higher than the reference voltage VR[n+1] are all "1".

On the other hand, an SR latch[n] in the latch circuit 13 corresponding to the reference voltage VR[n] performs a latch operation using voltage comparison results regarding the reference voltages VR[n−1] and VR[n+1] which are located alternately with the reference voltage VR[n] interposed therebetween as described above.

That is, the SR latch[n] performs a latch operation based on the positive-side output OP[n−1] of the voltage comparator VCMP[n−1] and the negative-side output ON[n+1] of the voltage comparator VCMP[n+1]. Further, the SR latch[n+1] performs a latch operation based on the positive-side output OP[n] of the voltage comparator VCMP[n] and the negative-side output ON[n+2] of the voltage comparator VCMP[n+2].

Here, not only the positive-side output OP[n−1] and the negative-side output ON[n+1] are "1" but the positive-side output OP[n] and the negative-side output ON[n+2] are also "1" as described above. Therefore, the outputs of both the SR latch[n] and the SR latch[n+1], that is, two bits corresponding to the two adjacent reference voltages VR[n] and VR[n+1], are simultaneously "1".

Such a situation also occurs at each time comparison circuit TDS. As illustrated in FIG. 6 described above, the time comparison circuit TDS[m] performs a time comparison operation based on voltage comparison results of two voltage comparators VCMP[m+1] and VCMP[m−1] adjacent to the corresponding voltage comparator VCMP[m]. Thus, for example, when the held voltage $V_{OTH}$ is located between the reference voltages VR[m] and VR[m+1], not only the time comparison circuit TDS[m] but also the time comparison circuit TDS[m+1] perform the time comparison operation, such that L-bit binary codes $D_B[m]$ and $D_B[m+1]$ which are the time comparison results are output from the time comparison circuits TDS[m] and TDS[m+1].

Here, the voltage comparator VCMP[m] corresponding to VR[n] outputs a valid binary code $D_B[m]$ only when the held voltage $V_{OTH}$ is present within the approximate voltage range A[n] as illustrated in FIG. 5 described above and the bits of the binary code $D_B[m]$ all indicate "1" when the held voltage $V_{OTH}$ is present within the approximate voltage range A[n+1]. The carry bit C[m] described above indicates such a state.

Thus, a binary code $D_B[m]$ regarding an approximate voltage range A[n] for which the carry bit C[m] indicates "1" is invalid and bits of the $2^K$-bit masked thermometer code DM regarding the approximate voltage range A[n] also need to be made invalid.

For this reason, the output circuit 15 masks the $2^K+2$-bit thermometer code $D_A$ based on the $2^K$ carry bits C through the bit mask circuit 15A.

FIG. 10 illustrates an exemplary operation of the bit mask circuit. As illustrated in FIG. 10, the bit mask circuit 15A bit-masks $2^K$ bits excluding the most significant bit (MSB) and the least significant bit (LSB) of the $2^K+2$-bit thermometer code $D_A$ corresponding to the approximate voltage range A[n] based on the input $2^K$ carry bits C to output a $2^K$-bit masked thermometer code DM. In FIG. 10, "X" indicates indefinite (don't care).

For example, when the held voltage $V_{OTH}$ is present within the approximate voltage range A[1], "0XX . . . XXXXX" is input as carry bits C and thus the bit mask circuit 15A masks only the $2^K+1$-th bit from the LSB of the thermometer code $D_A$ "1X000 . . . 00000" by "o" and outputs a $2^K$-bit masked thermometer code DM "0000 . . . 0000" excluding the MSB and LSB. This masked thermometer code DM is encoded and converted into K-bit upper binary data DU "00 . . . 000" by the upper encoder 15B.

Further, when the held voltage $V_{OTH}$ is present within the approximate voltage range A[$2^K$], "XXX . . . XXX10" is input as carry bits C and thus the bit mask circuit 15A masks the 3rd bit from the LSB of the thermometer code $D_A$ "11111 . . . 111X0" by "1" and masks the 2nd bit from the LSB of the thermometer code $D_A$ "11111 . . . 111X0" by "1" and outputs a $2^K$-bit masked thermometer code DM "1111 . . . 1110" excluding the MSB and LSB. This masked thermometer code DM is encoded and converted into K-bit upper binary data DU "11 . . . 110" by the upper encoder 15B.

Operation of Present Embodiment

Figure 11:
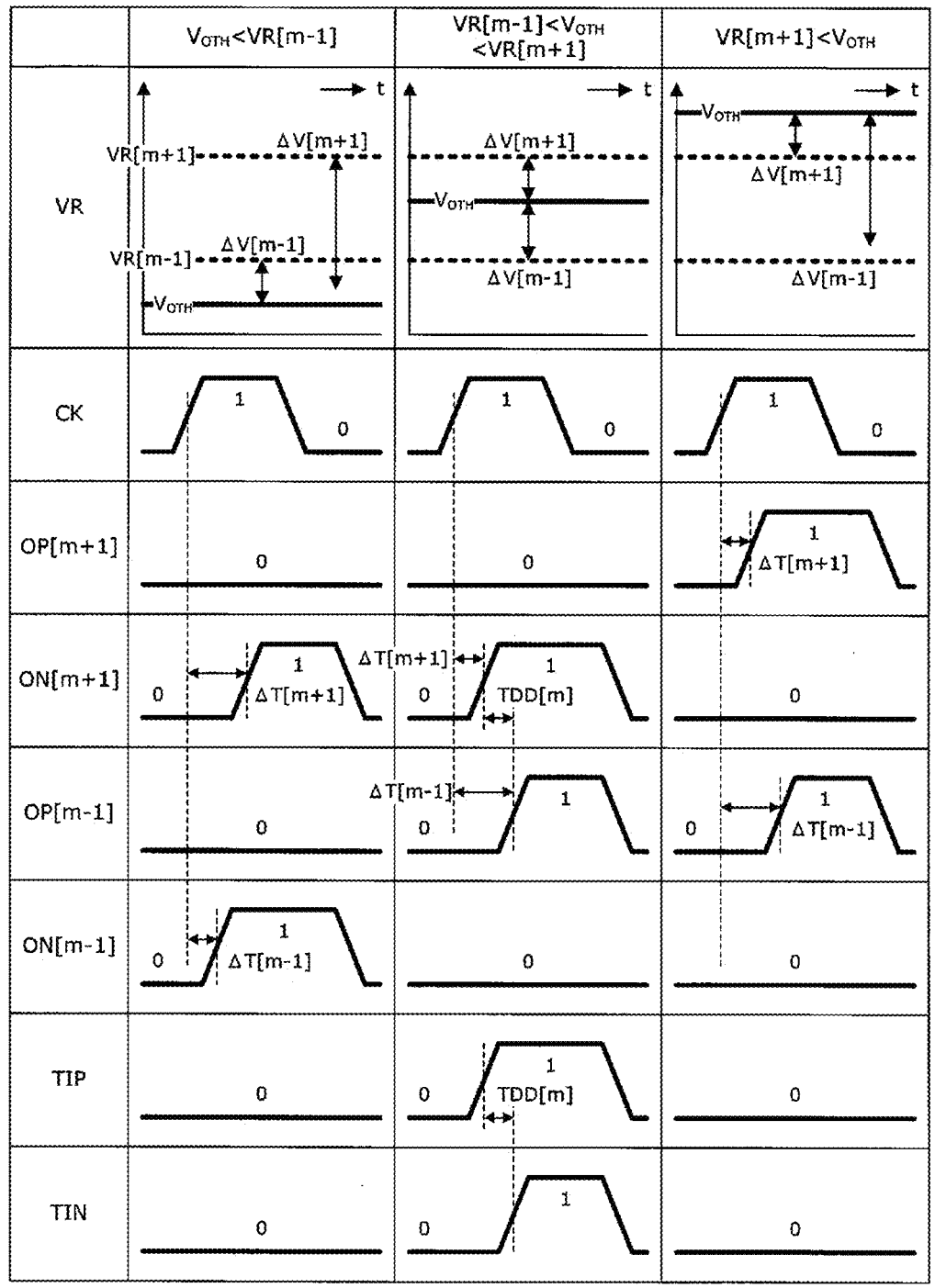
FIG. 11 is an explanatory diagram illustrating voltage comparison operations of a first comparison circuit.
Figure 12:
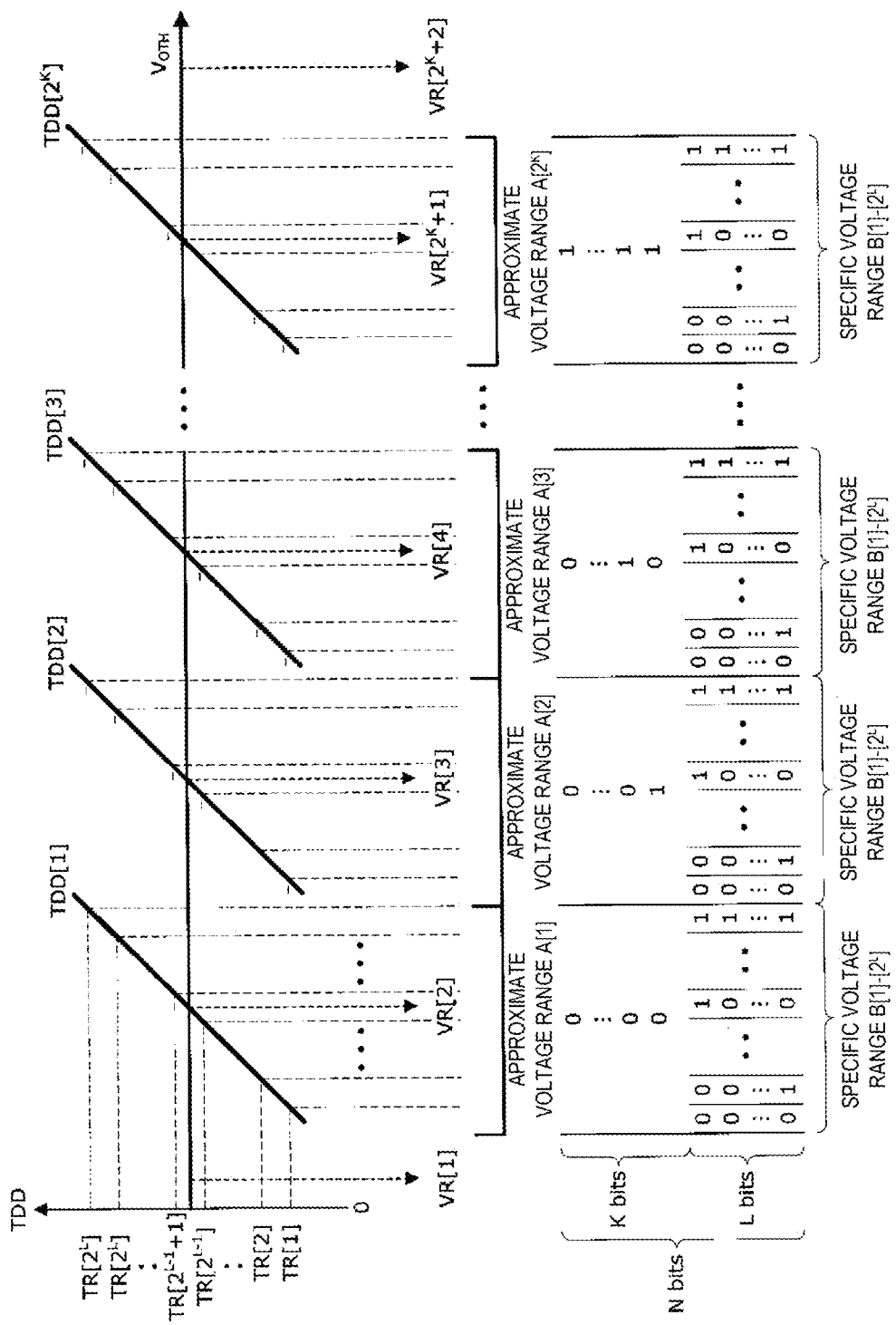
FIG. 12 is an explanatory diagram illustrating time comparison operations of a second comparison circuit.

Next, voltage comparison operations and time comparison operations of the analog-to-digital converter 10 according to the present embodiment will be described with reference to FIG. 11. FIG. 11 is an explanatory diagram illustrating voltage comparison operations of the first comparison circuit. FIG. 12 is an explanatory diagram illustrating time comparison operations of the second comparison circuit.

Focusing on a time comparison circuit TDS[m] of the second comparison circuit 14 corresponding to a reference voltage VR[m], voltage comparison operations of voltage comparators VCMP[m−1] and VCMP[m−1] of the first comparison circuit 12 which are time comparison targets of the time comparison circuit TDS[m] and a time comparison operation of TDS[m] based on voltage comparison results of these VCMP[m−1] and VCMP[m−1] will be described below.

Voltage Comparison Operation

First, voltage comparison operations of the voltage comparators VCMP will be described.

Synchronously with a clock signal CK having a constant frequency, the voltage comparators VCMP[m] in the first comparison circuit 12 compare corresponding reference voltages VR[m] with a held voltage $V_{OTH}$ output from the track-and-hold circuit 11 in parallel and output positive-side outputs OP[m] and negative-side outputs ON[m] as voltage comparison results.

Here, delay times ΔT[m] of the positive-side output OP[m] and the negative-side output ON[m] output from each voltage comparator VCMP[m] with respect to the clock signal CK at the rising edge change depending on the input voltage difference ΔV between the reference voltage VR[m] and the held voltage $V_{OTH}$ as described above.

As illustrated in FIG. 11, for example, when the held voltage is such that $V_{OTH}$<VR[m−1], the input voltage difference ΔV[m+1] between $V_{OTH}$ and VR[m+1] is greater than the input voltage difference ΔV[m−1] between $V_{OTH}$ and VR[m−1] (ΔV[m−1]<ΔV[m+1]). Therefore, the delay time ΔT[m+1] of OP[m+1] is longer than the delay time ΔT[m−1] of ON[m−1] (ΔT[m−1]<ΔT[m+1]). In this case, the time comparison circuit TDS[m] does not perform a time comparison operation because ON[m−1] is at level "1".

When the held voltage is such that VR[m−1]<$V_{OTH}$<VR[m+1] and the input voltage difference ΔV[m+1] between $V_{OTH}$ and VR[m+1] is smaller than the input voltage difference ΔV[m−1] between $V_{OTH}$ and VR[m−1] (ΔV[m−1]>ΔV[m+1]), the delay time ΔT[m+1] of OP[m+1] is shorter than the delay time ΔT[m−1] of ON[m−1] (ΔT[m−1]>ΔT[m+1]). Therefore, ON[m−1] rises later than OP[m+1]. In this case, the time comparison circuit TDS[m] performs a time comparison operation because both ON[m−1] and OP[m+1] are kept at level "0". In this time comparison operation, the comparison operation time difference TDD[m] between ΔT[m−1] and ΔT[m+1] is compared in time with $2^L$ reference times [i].

On the other hand, when the held voltage is such that VR[m−1]<$V_{OTH}$<VR[m+1] and the input voltage differences are such that ΔV[m−1]<ΔV[m+1], the delay times are such that ΔT[m−1]<ΔT[m+1]. Therefore, ON[m−1] rises earlier than OP[m+1]. In this case, the time comparison circuit TDS[m] also performs a time comparison operation because both ON[m−1] and OP[m+1] are kept at level "0". In this time comparison operation, the comparison operation time difference TDD[m] between ΔT[m−1] and ΔT[m+1] is compared in time with $2^L$ reference times [i].

When the held voltage is such that $V_{OTH}$>VR[m+1], the input voltage difference ΔV[m−1] between $V_{OTH}$ and VR[m−1] is greater than the input voltage difference ΔV[m+1] between $V_{OTH}$ and VR[m+1] (ΔV[m−1]>ΔV[m+1]). Therefore, the delay time ΔT[m−1] of OP[m−1] is longer than the delay time ΔT[m+1] of ON[m+1] (ΔT[m−1]>ΔT[m+1]). In this case, the time comparison circuit TDS[m] does not perform a time comparison operation because OP[m+1] is at level "1".

Time Comparison Operation

Next, time comparison operations of the time comparison circuit TDS will be described.

The switching circuit SW of the time comparison circuit TDS[m] outputs the negative-side output ON[m+1] of the voltage comparator VCMP[m+1] and the positive-side output OP[m−1] of the voltage comparator VCMP[m−1] to each time comparator TCMP[i] as voltage comparison results TIP and TIN, respectively, when both the negative-side output ON[m−1] of the voltage comparator VCMP[m−1] and the positive-side output OP[m+1] of the voltage comparator VCMP[m+1] are at level "0" as illustrated in FIG. 6 described above.

The time comparator TCMP[i] starts a time comparison operation in response to the input of the voltage comparison results TIP and TIN as illustrated in FIG. 8 described above. First, the variable delay circuit 31P in the delay circuit 30 delays the voltage comparison result TIP by a reference time TR[i] designated by a delay instruction DP[i] and outputs a delay signal TRP and the variable delay circuit 31N delays the voltage comparison result TIN by a reference time TR[i] designated by a delay instruction DN[i] and outputs a delay signal TRN.

The SR latch 33 performs a latch operation based on the delay signal TOP from the variable delay circuit 31P which has been input to the S input terminal via the inverter 32P and the delay signal TON from the variable delay circuit 31N which has been input to the R input terminal via the inverter 32N to output 1-bit binary data $D_T[i]$. Here, due to this latch operation, the binary data $D_T[i]$ output from the output terminal Q becomes level "1" if the delay signal TOP at the S input terminal rises earlier than the delay signal TON at the R input terminal. On the other hand, the binary data $D_T[i]$ output from the output terminal Q becomes level "0" if the delay signal TOP at the S input terminal rises later than the delay signal TON at the R input terminal.

Thus, for example, it is understood that the comparison operation time difference TDD is longer than the reference time TR[i] when the voltage comparison result TIN has been delayed with respect to the voltage comparison result TIP by the comparison operation time difference TDD[m] and the binary data $D_T[i]$ that the time comparator TCMP[i] has obtained by delaying the voltage comparison result TIP by the reference time TR[i] indicates "1" as illustrated in FIG. 11. It is also understood that the comparison operation time difference TDD is shorter than the reference time TR[i+1] when the binary data $D_T[i+1]$ that the time comparator TCMP[i+1] has obtained by delaying the voltage comparison result TIP by the reference time TR[i+1] longer than the reference time TR[i] indicates "0". Thus, in this example, the comparison operation time difference TDD is located between the reference times TR[i] and TR[i+1].

As illustrated in FIG. 12, the $2^K+2$ voltage comparators VCMP[0] to VCMP[$2^{K+1}$] in the first comparison circuit 12 compare reference voltages VR[1] to [$2^K$] corresponding respectively to the $2^K$ approximate voltage ranges A[1] to [$2^K$] with the held voltage $V_{OTH}$ to identify a target approximate voltage range A[x] including the held voltage $V_{OTH}$ as described above.

Thereafter, of the $2^K$ time comparison circuits TDS[1] to TDS[$2^K$] in the second comparison circuit 14, a target time comparison circuit TDS[x] identifies a target specific voltage range B[x] including the held voltage $V_{OTH}$ among $2^L$ time comparison circuits TDS[1] to TDS[$2^L$] within the target approximate voltage range A[x] based on the comparison operation time difference TDD[x] included in a voltage comparison result regarding two adjacent approximate voltage ranges A[x+1] and A[x−1] that are vertically adjacent to the target approximate voltage range A[x].

K-bit binary data DU indicating the target approximate voltage range A[x] thus obtained corresponds to upper K-bit binary data of the converted digital output $D_{OUT}$. L-bit binary data DL indicating the target specific voltage range B[x] corresponds to lower L-bit binary data of the converted digital output $D_{OUT}$.

The output circuit 15 outputs a combination of the K-bit binary data DU with the L-bit binary data DL as an N(=K+L)-bit converted digital output $D_{OUT}$ which is a conversion result of the held voltage $V_{OTH}$.

FIG. 13 is an explanatory diagram illustrating the number of comparators operating during analog-to-digital conversion. For example, when 10-bit (N=10) analog-to-digital conversion is performed, it is necessary to operate 1023 voltage comparators in parallel as illustrated in FIG. 13 according to the circuit configuration of the related art of FIG. 14 described above. On the other hand, when the number of K bits is 3 and the number of L bits is 7, it is only necessary to operate 266 comparators that combine voltage comparators VCMP and time comparators TCMP in parallel according to the circuit configuration of embodiments of the present invention. Therefore, the number of comparators operating during analog-to-digital conversion is reduced to 26.0% as compared with the technique of the related art.

Effects of Present Embodiment

As described above, in the present embodiment, the second comparison circuit 14 is configured such that a target time comparison circuit TDS[x] corresponding to a target approximate voltage range A[x] among the $2^K$ time comparison circuits TDS[m] compares a comparison operation time difference TDD included in voltage comparison results regarding two adjacent approximate voltage ranges A[x+1] and A[x−1] that are vertically adjacent to the target approximate voltage range A[x] with $2^L$ reference times TR corresponding to $2^L$ specific voltage ranges B and generates a target binary code $D_B[x]$ of L bits indicating a target specific voltage range B[x] including the held voltage $V_{OTH}$ from the obtained time comparison results.

The output circuit 15 is configured to generate upper K-bit binary data of the converted digital output $D_{OUT}$ based on the thermometer code $D_A$ of $2^K+2$ bits indicating the target approximate voltage range A[x] including the held voltage $V_{OTH}$ that the latch circuit 13 has obtained by latching voltage comparison results from the first comparison circuit 12 and generate lower L-bit binary data DL of the converted digital output $D_{OUT}$ based on the full binary codes $D_B$ of L×$2^K$ bits obtained by the second comparison circuit 14.

In this way, of the $2^K$ time comparison circuits TDS[1] to TDS[$2^K$] in the second comparison circuit 14, the target time comparison circuit TDS[x] identifies the target specific voltage range B[x] including the held voltage $V_{OTH}$ among $2^L$ time comparison circuits TDS[1] to TDS[$2^L$] within the target approximate voltage range A[x] based on the comparison operation time difference TDD[x] included in a voltage comparison result regarding two adjacent approximate voltage ranges A[x+1] and A[x−1] that are vertically adjacent to the target approximate voltage range A[x].

Accordingly, the converted digital output $D_{OUT}$ of N bits (where N=K+L) indicating the held voltage $V_{OTH}$ can be obtained only by operating the $2^K+2$ voltage comparators VCMP provided in the first comparison circuit 12 and the $2^L$ time comparators TCMP provided in the target time comparison circuit TDS[x] during analog-to-digital conversion. Thus, as compared with when $2^N-1$ voltage comparators operate in parallel, the number of comparators operating during analog-to-digital conversion can be effectively reduced, and as a result, the overall power consumption of the analog-to-digital converter 10 can be significantly reduced.

Further, because the comparison operation time difference TDD included in a voltage comparison result regarding two adjacent approximate voltage ranges A[x+1] and A[x−1] that are vertically adjacent to the target approximate voltage range A[x] is used as a comparison operation time difference TDD to be compared with a reference time TR in the target time comparison circuit TDS[x], good linearity can be achieved for the voltage-to-time conversion characteristics used when converting the input voltage differences ΔV between the held voltage $V_{OTH}$ and VR[n] into the delay times ΔT. Thus, restrictions on the resolution of the voltage-to-time conversion characteristics as well as on the conversion speed thereof can be reduced, $2^L$ which is the number of specific voltage ranges B that can be set within an approximate voltage range A can be increased, and $2^K$ which is the number of voltage comparators VCMP can be more effectively reduced.

In addition, in the present embodiment, the first comparison circuit 12 may be configured to compare, at each voltage comparator VCMP[n], the reference voltage VR[n] assigned to the voltage comparator VCMP[n] with the held voltage $V_{OTH}$ and output a positive-side output OP[n] indicating that $V_{OTH}$>VR[n] and a negative-side output ON[n] indicating that $V_{OTH}$<VR[n] as the voltage comparison result.

Thereby, it is possible to efficiently obtain the voltage comparison result in which the input voltage difference ΔV between the held voltage $V_{OTH}$ and VR[n] is included in the time domain.

Further, in the present embodiment, the latch circuit 13 may include $2^K+2$ latches L[n] configured to perform latch operations based on the positive-side outputs OP[n] and the negative-side outputs ON[n] to generate the thermometer code $D_A$ of $2^K+2$ bits based on obtained latch outputs.

Thereby, the thermometer code $D_A$ indicating the target approximate voltage range A[x] including the held voltage $V_{OTH}$ among the $2^K$ preset approximate voltage ranges A can be efficiently generated based on the voltage comparison results obtained by the first comparison circuit 12.

Furthermore, in the present embodiment, each of the time comparison circuits TDS[m] may include $2^L$ time comparators TCMP[i] and may be configured such that, when a time comparison circuit TDS[m] is the target time comparison circuit TDS[x], the time comparison circuit TDS[m] compares, at the time comparator TCMP[i], the reference time TR[i] assigned to the time comparator TCMP[i] with the comparison operation time difference TDD which is a time difference between the positive-side output OP[m+1] of the voltage comparator VCMP[m+1] and the negative-side output ON[m−1] of the voltage comparator VCMP[m−1] to generate the target binary code $D_B$[x] of L bits.

Thereby, good linearity can be achieved for the voltage-to-time conversion characteristics used when converting the input voltage differences ΔV between the held voltage $V_{OTH}$ and VR[n] into the delay times ΔT by merely switching connections between the circuits without adding a new circuit.

In addition, in the present embodiment, the delay circuit 30 in the time comparator TCMP[i] may be configured to delay one of the positive-side output OP[m+1] and the negative-side output ON[m−1] that have been input by the reference time TR[i] and the SR latch 33 may be configured to perform a latch operation based on the positive-side output OP[m+1] and the negative-side output ON[m−1] output from the delay circuit 30 to output 1-bit binary data $D_T$[i] indicating a time comparison result between the comparison operation time difference TDD and the reference time TR[i].

Thereby, the comparison operation time difference TDD [m] included in the positive-side output OP[m+1] and the negative-side output ON[m−1] that have been input can be compared with the reference time TR[i] with an extremely simple circuit configuration.

Further, in the present embodiment, the switching circuit SW in the time comparison circuit TDS[m] may be configured to perform switching control of an input of the negative-side output ON[m−1] to the time comparator TCMP[i] based on the positive-side output OP[m+1] of the voltage comparator VCMP[m+i] while performing switching control of an input of the positive-side output OP[m+1] to the time comparator TCMP[i] based on the negative-side output ON[m−1] of the voltage comparator VCMP[m−1].

Thereby, the time comparison operation can be executed only using the target time comparison circuit TDS[x] corresponding to the target approximate voltage range A[x] including the held voltage $V_{OTH}$ and the number of comparators operating during analog-to-digital conversion can be effectively reduced with an extremely simple circuit configuration.

Extensions of Embodiments

Although the present invention has been described with reference to embodiments, the present invention is not limited to the above embodiments. Various changes that can be understood by those skilled in the art can be made to the configurations and details of the present invention without departing from the scope of the present invention.

REFERENCE SIGNS LIST

10 Analog-to-digital converter
11 Track-and-hold circuit
12 First comparison circuit
VCMP Voltage comparator
13 Latch circuit
14 Second comparison circuit
TDS Time comparison circuit
SW Switching circuit
TCMP Time comparator
ENC Encoder
15 Output circuit
15A Bit mask circuit
15B Upper encoder
15C Lower selector
21P, 21N Buffer
22P, 22N, 24P, 24N Inverter
23P, 23N NAND
30 Delay circuit
31P, 31N Variable delay circuit
32P, 32N Inverter
33 SR latch
$V_{IN}$ Analog input voltage
$V_{OTH}$ Held voltage
VR Reference voltage
OP Positive-side output
ON Negative-side output
$D_A$ Thermometer code
$D_B$ Binary code
C Carry bit
$D_{OUT}$ Converted digital output

The invention claimed is:

1. An analog-to-digital converter comprising:
a track-and-hold circuit configured to sample and hold an analog input voltage and output a held voltage obtained by sampling and holding the analog input voltage;
a first comparison circuit including n $2^K+2$ voltage comparators (where K is an integer of at least 1 and less than N (where N is an integer of at least 2) and n is an integer of 0 to $2^K+1$), the first comparison circuit being configured to compare, at each of the voltage comparators, reference voltages respectively assigned to the voltage comparators with the held voltage to output $2^K+2$ voltage comparison results;
a latch circuit configured to latch the voltage comparison results to generate a thermometer code indicating x target approximate voltage ranges (where x is an integer of 1 to $2^K$) including the held voltage among $2^K$ preset approximate voltage ranges;
a second comparison circuit including m $2^K$ time comparison circuits (where m is an integer of 1 to $2^K$) corresponding to the target approximate voltage ranges, respectively, the second comparison circuit being configured such that a target time comparison circuit corresponding to the target approximate voltage range among the time comparison circuits is configured to compare a comparison operation time difference included in voltage comparison results, among the voltage comparison results output from the first comparison circuit, regarding two adjacent approximate voltage ranges that are vertically adjacent to the target approximate voltage range with $2^L$ reference times (where L=N−K) corresponding to $2^L$ specific voltage ranges and generate a target binary code of L bits indicating a target specific voltage range including the held voltage within the target approximate voltage range from $2^L$ obtained time comparison results to output full binary codes of L×$2^K$ bits that combine non-target binary codes of L bits output from $2^K$−1 time comparison circuits other than the target time comparison circuit and the target binary code; and an output circuit configured to generate upper K-bit binary data of a converted digital output of N bits based on the thermometer code output from the latch circuit and generate lower L-bit binary data of the converted digital output based on the full binary codes output from the second comparison circuit.

2. The analog-to-digital converter according to claim 1, wherein the first comparison circuit is configured to compare, at each of the voltage comparators, the reference voltages assigned to the voltage comparators with the held voltage to output a positive-side output indicating that the held voltage is greater than the reference voltage and a negative-side output indicating that the held voltage is less than the reference voltage as the voltage comparison results.

3. The analog-to-digital converter according to claim 2, wherein the latch circuit includes n $2^K+2$ latches configured to perform latch operations based on the positive-side output and the negative-side output to generate the thermometer code of $2^K+2$ bits based on obtained latch outputs.

4. The analog-to-digital converter according to claim 2, wherein each of the time comparison circuits includes i $2^L$ time comparators (where i is an integer of 1 to $2^L$) and is configured such that, when a first time comparison circuit among the time comparison circuits is the target time comparison circuit, the first time comparison circuit compares, at the time comparators, a comparison operation time difference which is a time difference between a positive-side output of a first voltage comparator among the voltage comparators and a negative-side output of a second voltage comparator among the voltage comparators with reference times assigned to the time comparators, respectively, to generate the target binary code of L bits.

5. The analog-to-digital converter according to claim 4, wherein each of the time comparators includes a delay circuit configured to delay one of the positive-side output and the negative-side output that are input by a first reference time among the reference times and a latch circuit configured to perform a latch operation based on the positive-side output and the negative-side output output from the delay circuit to output 1-bit binary data indicating a time comparison result between the comparison operation time difference and the first reference time.

6. The analog-to-digital converter according to claim 4, wherein each of the time comparison circuits includes a switching circuit configured to perform switching control of an input of the negative-side output to a first time comparator among the time comparators based on the positive-side output of the first voltage comparator while performing switching control of an input of the positive-side output to the first time comparator based on the negative-side output of the second voltage comparator.

7. A method of operating an analog-to-digital converter, the method comprising:
sampling and holding, by a track-and-hold circuit, an analog input voltage, and outputting a held voltage obtained by sampling and holding the analog input voltage;
comparing, by a first comparison circuit including n $2^K+2$ voltage comparators (where K is an integer of at least 1 and less than N (where N is an integer of at least 2) and n is an integer of 0 to $2^K+1$), at each of the voltage comparators, reference voltages respectively assigned to the voltage comparators with the held voltage to output $2^K+2$ voltage comparison results;

latching, by a latch circuit, the voltage comparison results to generate a thermometer code indicating x target approximate voltage ranges (where x is an integer of 1 to $2^K$) including the held voltage among $2^K$ preset approximate voltage ranges;

comparing, by a target time comparison circuit of a second comparison circuit including m $2^K$ time comparison circuits (where m is an integer of 1 to $2^K$) corresponding to the target approximate voltage ranges, respectively, the time target comparison circuit corresponding to the target approximate voltage range among the time comparison circuits, a comparison operation time difference included in voltage comparison results, among the voltage comparison results output from the first comparison circuit, regarding two adjacent approximate voltage ranges that are vertically adjacent to the target approximate voltage range with $2^L$ reference times (where L=N−K) corresponding to $2^L$ specific voltage ranges and generating a target binary code of L bits indicating a target specific voltage range including the held voltage within the target approximate voltage range from $2^L$ obtained time comparison results to output full binary codes of L×$2^K$ bits that combine non-target binary codes of L bits output from $2^K$−1 time comparison circuits other than the target time comparison circuit and the target binary code; and generating, by an output circuit, upper K-bit binary data of a converted digital output of N bits based on the thermometer code output from the latch circuit and generating lower L-bit binary data of the converted digital output based on the full binary codes output from the second comparison circuit.

8. The method according to claim 7, wherein the first comparison circuit compares, at each of the voltage comparators, the reference voltages assigned to the voltage comparators with the held voltage to output a positive-side output indicating that the held voltage is greater than the reference voltage and a negative-side output indicating that the held voltage is less than the reference voltage as the voltage comparison results.

9. The method according to claim 8, wherein the latch circuit includes n $2^K+2$ latches performing latch operations based on the positive-side output and the negative-side output to generate the thermometer code of $2^K+2$ bits based on obtained latch outputs.

10. The method according to claim 8, wherein each of the time comparison circuits includes i $2^L$ time comparators (where i is an integer of 1 to $2^L$), and wherein, when a first time comparison circuit among the time comparison circuits is the target time comparison circuit, the first time comparison circuit compares, at the time comparators, a comparison operation time difference which is a time difference between a positive-side output of a first voltage comparator among the voltage comparators and a negative-side output of a second voltage comparator among the voltage comparators with reference times assigned to the time comparators, respectively, to generate the target binary code of L bits.

11. The method according to claim 10, wherein each of the time comparators includes a delay circuit delaying one of the positive-side output and the negative-side output that are input by a first reference time among the reference times and a latch circuit performing a latch operation based on the positive-side output and the negative-side output output from the delay circuit to output i-bit binary data indicating a time comparison result between the comparison operation time difference and the first reference time.

12. The method according to claim 10, wherein each of the time comparison circuits includes a switching circuit performing switching control of an input of the negative-side output to a first time comparator among the time comparators based on the positive-side output of the first voltage comparator while performing switching control of an input of the positive-side output to the first time comparator based on the negative-side output of the second voltage comparator.

* * * * *